United States Patent
Sumiya et al.

(10) Patent No.: US 9,061,336 B2
(45) Date of Patent: Jun. 23, 2015

(54) WIRE DRAWING DIE

(75) Inventors: Hitoshi Sumiya, Itami (JP); Makoto Yukawa, Sumoto (JP)

(73) Assignees: SUMITOMO ELECTRIC INDUSTRIES, LTD., Osaka-shi (JP); A.L.M.T. CORP., Tokyo (JP); SUMITOMO ELECTRIC HARDMETAL CORP., Itami-shi (JP)

( * ) Notice: Subject to any disclaimer, the term of this patent is extended or adjusted under 35 U.S.C. 154(b) by 818 days.

(21) Appl. No.: 12/523,545

(22) PCT Filed: Jan. 18, 2008

(86) PCT No.: PCT/JP2008/050621
§ 371 (c)(1),
(2), (4) Date: Jul. 17, 2009

(87) PCT Pub. No.: WO2008/088048
PCT Pub. Date: Jul. 24, 2008

(65) Prior Publication Data
US 2010/0043520 A1 Feb. 25, 2010

(30) Foreign Application Priority Data
Jan. 19, 2007 (JP) .................................. 2007-010101

(51) Int. Cl.
*B21C 3/02* (2006.01)
*B21C 3/18* (2006.01)
(Continued)

(52) U.S. Cl.
CPC . *B21C 3/025* (2013.01); *B21C 3/18* (2013.01); *C30B 29/605* (2013.01); *B01J 3/062* (2013.01);
(Continued)

(58) Field of Classification Search
CPC ........ B21C 3/025; B21C 3/18; C30B 29/605; B01J 3/062
USPC .................................... 72/274, 467; 76/107.4
See application file for complete search history.

(56) References Cited

U.S. PATENT DOCUMENTS 7,516,804 B2 * 4/2009 Vail ............................... 175/434
7,799,427 B2 * 9/2010 Gill et al. ...................... 428/408
(Continued)

FOREIGN PATENT DOCUMENTS

| JP | 5-146820 A | 6/1993 |
| JP | 2002-66302 A | 3/2002 |

(Continued)

OTHER PUBLICATIONS

Sumiya et al., "Microstructure features of polycrystalline diamond synthesized directly from graphite under static high pressure", Journal of Materials Science, vol. 39, No. 2, 2004, pp. 445-450, XP002573562.
(Continued)

*Primary Examiner* — Shelley Self
*Assistant Examiner* — Mohammad I Yusuf
(74) *Attorney, Agent, or Firm* — Birch, Stewart, Kolasch & Birch, LLP

(57) ABSTRACT

One object of the present invention is to provide a wire drawing die excellent in strength and wear resistance. The wire drawing die has a core formed using highly hard diamond polycrystalline body made substantially only of diamond and produced by directly converting a raw material composition including a non-diamond type carbon material into diamond and sintering the diamond at an ultra high pressure and an ultra high temperature without adding a sintering aid or a catalyst, the polycrystalline body having a mixed construction including fine-grained diamond crystals with a maximum grain size of less than or equal to 100 nm and an average grain size of less than or equal to 50 nm and plate-like or particulate coarse-grained diamond crystals with a minimum grain size of greater than or equal to 50 nm and a maximum grain size of less than or equal to 10000 nm.

12 Claims, 3 Drawing Sheets

DIE INTERNAL DIAMETER

(51) Int. Cl.
  *C30B 29/60* (2006.01)
  *B01J 3/06* (2006.01)
  *B82Y 30/00* (2011.01)
  *C04B 35/52* (2006.01)
  *C04B 35/645* (2006.01)

(52) U.S. Cl.
  CPC ..... *B01J 2203/061* (2013.01); *B01J 2203/0625* (2013.01); *B01J 2203/0655* (2013.01); *B01J 2203/068* (2013.01); *B01J 2203/0685* (2013.01); *B82Y 30/00* (2013.01); *C04B 35/52* (2013.01); *C04B 35/645* (2013.01); *C04B 2235/422* (2013.01); *C04B 2235/425* (2013.01); *C04B 2235/427* (2013.01); *C04B 2235/656* (2013.01); *C04B 2235/781* (2013.01); *C04B 2235/783* (2013.01); *C04B 2235/785* (2013.01)

(56) References Cited

U.S. PATENT DOCUMENTS

| | | | |
|---|---|---|---|
| 7,998,573 B2 * | 8/2011 | Qian et al. | 428/325 |
| 2005/0019114 A1 | 1/2005 | Sung | |
| 2009/0305039 A1 | 12/2009 | Sumiya | |

FOREIGN PATENT DOCUMENTS

| | | |
|---|---|---|
| JP | 2003-33810 A | 2/2003 |
| JP | 2007-22888 A | 2/2007 |
| JP | 2007-55819 A | 3/2007 |
| JP | 2007-99559 A | 4/2007 |
| JP | 5-146820 A | 6/2010 |
| WO | WO-2007/011019 A1 | 1/2007 |

OTHER PUBLICATIONS

Bundy., "Direct Conversion of Graphite to Diamond in Static Pressure Apparatus", The Journal of Chemical Physics, vol. 38, No. 3, Feb. 1, 1963, pp. 631-643.

Wakatsuki et al., "Notes on Compressible Gasket and Bridgman-Anvil Type High Pressure Apparatus", Japanese Journal of Applied Physics, vol. 11, No. 4, Apr. 1972, pp. 578-590.

Naka et al., "Direct conversion of graphite to diamond under static pressure", Nature, vol. 259, Jan. 1-8, 1976, pp. 38-39.

Irifune et al., "Nature of Polycrystalline Diamond Synthesized by Direct Conversion of Graphite Using Kawai-Type Multianvil Apparatus", New Diamond and Frontier Carbon Technology, vol. 14, No. 5, 2004, pp. 313-327.

Sumiya et al., "Synthesis of High-purity Nano-Polycrystalline Diamond and Its Characterization", SEI Technical Review, Sep. 2004, vol. 165, pp. 68-74.

Burnley, "The Multi-Anvil Apparatus", Teaching Mineralogy Topical Resources, Sep. 16, 2013, 9 pages.

\* cited by examiner

DIE INTERNAL DIAMETER

WIRE DRAWING DIE

TECHNICAL FIELD

The present invention relates to a diamond die for drawing a wire such as a metal wire, and in particular relates to a die for drawing an ultra fine wire of copper, gold, or the like, or a highly hard wire such as a stainless wire, a steel cord, or the like.

BACKGROUND ART

Conventionally, as a wire drawing die for drawing an ultra fine wire with a hole diameter of 50 μm or less, the one having a shape as shown in FIG. 1 made of natural monocrystalline diamond or synthetic monocrystalline diamond has been used. However, monocrystalline diamond has a problem that, when it is used for wire drawing for a long period of time, uneven wear as shown FIG. 2B occurs and a wire surface is deteriorated. In diamond monocrystal, distances between crystal lattice planes differ depending on orientation, and the lattice planes have different in-plane atomic densities. Therefore, diamond monocrystal has wear resistance that is significantly direction-dependent, which causes uneven wear after wire drawing and deterioration in the wire surface.

Further, a die for drawing a highly hard wire such as a stainless wire, a steel cord, or the like has a problem that an excess stress is exerted on the die during wire drawing and a crack due to cleavage occurs. Therefore, polycrystalline diamond is generally used at present for such an application.

Currently, all polycrystalline diamonds marketed for use in tools use an iron group metal such as Co, Ni, Fe, or a ceramic such as SiC, as a sintering aid or a binding agent. They are obtained by sintering diamond powder together with a sintering aid or a binding agent under high-pressure and high-temperature conditions in which diamond is thermodynamically stable (generally, at a pressure of 5 to 6 GPa and at a temperature of 1300 to 1500° C.). However, since they contain around 10% by volume of a sintering aid or a binding agent, it is not possible to obtain a highly precise hole surface, and thus such a polycrystalline diamond is not applicable to ultra fine wire drawing. Although naturally produced polycrystalline diamonds (carbonado and ballas) are also known, and some of them are used as a drill bit, they have many defects and they considerably vary in material quality. Therefore, they are not used for the application as a die.

On the other hand, a polycrystalline body of single phase diamond having no binding agent is obtained by directly converting non-diamond carbon such as graphite, glassy carbon, amorphous carbon, or the like into diamond and simultaneously sintering the diamond at an ultra high pressure and an ultra high temperature without a catalyst or a solvent.

As such a polycrystalline body, for example, J. Chem. Phys., 38 (1963) 631-643 [F. P. Bundy] (Non-Patent Document 1), Japan. J. Appl. Phys., 11 (1972) 578-590 [M. Wakatsuki, K. Ichinose, T. Aoki] (Non-Patent Document 2), and Nature 259 (1976) 38 [S. Naka, K. Horii, Y. Takeda, T. Hanawa] (Non-Patent Document 3) disclose obtaining polycrystalline diamond by subjecting graphite as a starting material to direct conversion at an ultra high pressure of 14 to 18 GPa and an ultra high temperature of 3000 K or more.

Further, Japanese Patent Laying-Open No. 2002-066302 (Patent Document 1) describes a method of synthesizing fine diamond by heating carbon nanotube to 10 GPa or more and 1600° C. or more.

Furthermore, New Diamond and Frontier Carbon Technology, 14 (2004) 313 [T. Irifune, H. Sumiya] (Non-Patent Document 4) and SEI Technical Review 165 (2004) 68 [Sumiya, Irifune] (Non-Patent Document 5) disclose a method of obtaining dense and highly pure polycrystalline diamond by subjecting highly pure graphite as a starting material to direct conversion and sintering by indirect heating at an ultra high pressure of 12 GPa or more and an ultra high temperature of 2200° C. or more.

Patent Document 1: Japanese Patent Laying-Open No. 2002-066302

Non-Patent Document 1: J. Chem. Phys., 38 (1963) 631-643 [F. P. Bundy]

Non-Patent Document 2: Japan. J. Appl. Phys., 11 (1972)578-590 [M. Wakatsuki, K. Ichinose, T. Aoki]

Non-Patent Document 3: Nature 259 (1976)38 [S. Naka, K. Horii, Y. Takeda, T. Hanawa]

Non-Patent Document 4: New Diamond and Frontier Carbon Technology, 14 (2004) 313 [T. Irifune, H. Sumiya]

Non-Patent Document 5: SEI Technical Review 165 (2004) 68 [Sumiya, Irifune]

DISCLOSURE OF THE INVENTION

Problems to be Solved by the Invention

However, since the polycrystalline diamonds described in Non-Patent Documents 1 to 3 are all made by directly passing an electric current through electrically conductive non-diamond carbon such as graphite and heating the same, it is unavoidable that unconverted graphite remains. Further, the diamonds have grains varying in size and tend to be sintered partly insufficiently. Therefore, it has been possible to obtain only a polycrystalline body with insufficient mechanical properties such as hardness and strength and with a chipped shape, and it has been impossible to obtain a polycrystalline body capable of being used as a wire drawing die.

Further, since the method disclosed in Patent Document 1 exerts pressure on carbon nanotube with a diamond anvil, and collects light and heats the carbon nanotube with a carbon dioxide gas laser, it is impossible to manufacture homogeneous polycrystalline diamond of a size applicable to wire drawing dies.

Furthermore, although the diamonds obtained by the methods disclosed in Non-Patent Documents 4 and 5 may have a very high hardness, they have insufficient reproducibility and unstable mechanical properties. Therefore, there has been a problem that, when they are used as wire drawing dies, their performances vary depending on samples.

The present invention has been made to solve the problems of the conventional techniques described above, and one object of the present invention is to provide a wire drawing die having a high strength and excellent heat resistance when compared with polycrystalline diamond containing a binding agent that has been conventionally marketed, and in particular a wire drawing die having a performance extremely excellent in drawing an ultra fine wire or a stainless wire or a steel cord, without causing problems such as uneven wear and cleavage cracks found in conventional monocrystalline diamond, by optimizing properties of polycrystalline diamond obtained by direct conversion and sintering to be applied to a wire drawing die.

Means for Solving the Problems

The inventors of the present invention have elaborately studied the relation between a microstructure of polycrystalline diamond obtained by direct conversion and mechanical properties and wear resistance property thereof to examine the causes of the above-mentioned problems. As a result, they have found that the polycrystalline diamond may have a composite construction in which a layered structure and a fine homogeneous structure are mixed, and the one having a composite construction in which these structures are distributed at an appropriate ratio is significantly hard and excellent in wear resistance. The inventors have also found that, in the conventional methods, the ratio between the layered structure and the fine homogeneous structure varies depending on the state of graphite serving as a starting material and minute differences in temperature rising time and pressure condition, and this is a cause of unstable mechanical properties and wear resistance property.

To solve the problems as described above, the inventors employed relatively coarse plate-like graphite or relatively coarse diamond with a non-graphite type carbon material or graphite with low crystallinity or fine-grained graphite added thereto, as a starting material, to the method of directly converting non-diamond carbon into diamond at an ultra high pressure and an ultra high temperature. As a result, they obtained polycrystalline diamond having a construction in which layered or relatively coarse diamond crystals were dispersed in a matrix of fine-grained diamond. The inventors have found that significantly hard and tough polycrystalline diamond can be obtained extremely stably by the effect of preventing plastic deformation and progression of fine cracks provided by the layered or coarse-grained diamond. The inventors have also found that, even in a case where graphite is used, a microstructure can be controlled by temperature rising time and pressure condition, and an appropriate construction as described above can be obtained.

After fabricating a die using this material and performing a wire drawing test, the inventors have found that a die having high wear resistance and less uneven wear and cleavage cracks can be obtained, depending on the starting material and synthesis conditions. Therefore, they have found that an extremely excellent wire drawing die having durability three or more times that of a conventional material can be obtained by optimizing a starting material and thereby optimizing the microstructure of polycrystalline diamond, and conceived of the present invention.

Specifically, the present invention has a characteristic that there is provided a die using polycrystalline diamond made substantially only of diamond and produced by directly converting a non-diamond type carbon material as a starting material into diamond and sintering the diamond at an ultra high pressure and an ultra high temperature without adding a sintering aid or a catalyst, the diamond having a mixed construction including fine-grained diamond with a maximum grain size of less than or equal to 100 nm and an average grain size of less than or equal to 50 nm and plate-like or particulate coarse-grained diamond with a minimum grain size of greater than or equal to 50 nm and a maximum grain size of less than or equal to 10000 nm. The polycrystalline diamond is provided with a hole through which a wire material subjected to wire drawing passes.

Preferably, the fine-grained diamond has a maximum grain size of less than or equal to 50 nm and an average grain size of less than or equal to 30 nm, and the coarse-grained diamond has a minimum grain size of greater than or equal to 50 nm and a maximum grain size of less than or equal to 1000 nm.

When the polycrystalline diamond is used in the die, it is preferable that the hole formed in the diamond has at least a surface working for machining with a surface roughness Ra of greater than or equal to 0.001 μm and less than or equal to 0.2 μm, and that the hole formed in the diamond has a circularity of greater than or equal to 0.01 μm and less than or equal to 0.2 μm when a cross section of a bearing portion is viewed. It is to be noted that, in the present application, the circularity refers to a difference between a maximum diameter and a minimum diameter when a hole diameter is viewed in all directions in 360°.

Further, it is preferable to form the hole with a reduction angle set as appropriate depending on the wire material subjected to wire drawing. Specifically, when a gold wire is subjected to wire drawing, the reduction angle is preferably set at 8 to 16°. When a copper wire is subjected to wire drawing, the reduction angle is preferably set at 8 to 16°. When a tungsten wire is subjected to wire drawing, the reduction angle is preferably set at 6 to 14°. When a stainless wire is subjected to wire drawing, the reduction angle is preferably set at 6 to 14°. When a steel cord is subjected to wire drawing, the reduction angle is preferably set at 6 to 14°.

Figure 1:
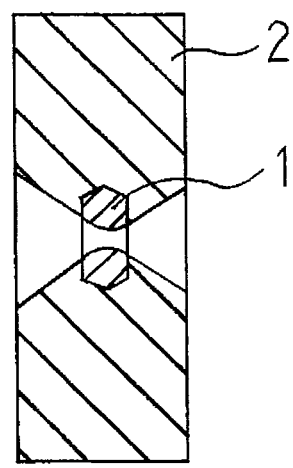
FIG. 1 is a schematic view of a cross section of a conventional monocrystalline diamond die.
Figure 2A:
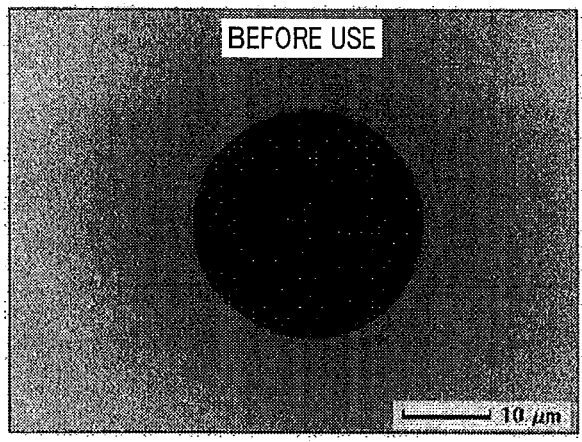
FIG. 2A is a photograph showing a worn state of the conventional monocrystalline diamond die, indicating the state before being worn.
Figure 2B:
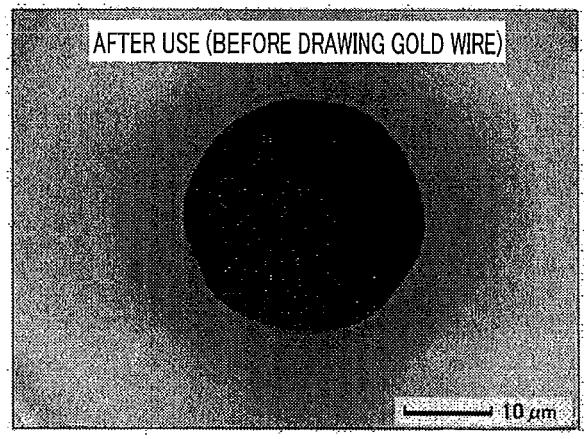
FIG. 2B is a photograph showing a worn state of the conventional monocrystalline diamond die, indicating the state after being worn.

DESCRIPTION OF THE REFERENCE SIGNS 1 monocrystalline diamond
2 case

BEST MODES FOR CARRYING OUT THE INVENTION

An appropriate amount of a non-graphite type carbon material is added to plate-like graphite or diamond with a grain size of 50 nm or more, to prepare a starting material. The starting material is directly converted into diamond and sintered under a pressure condition in which diamond is thermodynamically stable. As a result, polycrystalline diamond having a construction in which relatively coarse diamonds with an average grain size of, for example, 100 to 200 nm are dispersed in a matrix of significantly fine diamond with an average grain size of, for example, 10 to 20 nm is obtained. Since plastic deformation and progression of cracks are prevented at a relatively coarse diamond portion, the polycrystalline diamond exhibits an extremely tough and high hardness property, and property variations depending on samples are significantly reduced.

Preferably, the amount of the non-graphite type carbon material added to the plate-like graphite or diamond with a grin size of 50 mm or more is greater than or equal to 10% by volume and less than or equal to 95% by volume. If the added amount is less than 10% by volume, layered or coarse-grained diamonds are brought into contact with each other, stress is concentrated at an interface therebetween, and cracks and fractures are likely to occur, causing an unfavorable effect. If the added amount is greater than 95% by volume, the layered or coarse-grained diamond cannot sufficiently exhibit the effect of preventing plastic deformation and progression of fine cracks.

Examples of the non-graphite type carbon material described above include glassy carbon, amorphous carbon, fullerene, carbon nanotube, and the like. Fine carbon with a grain size of 50 nm or less prepared by mechanically pulverizing graphite using a planetary ball mill or the like can also be used.

The mixture described above is introduced into a capsule of a metal such as Mo. When pulverized fine carbon is used, it is necessary to perform the introducing operation within a highly pure inert gas. Next, the mixture introduced into the metal capsule is held for a prescribed period of time at a temperature of 1500° C. or more and at a pressure under which diamond is thermodynamically stable, using an ultra high pressure and ultra high temperature generation apparatus capable of performing isotropic pressurization or hydrostatic pressurization such as a multi-anvil type ultra high pressure apparatus or a belt type ultra high pressure apparatus. The non-graphite type carbon is directly converted into diamond and simultaneously sintered. In a case where plate-like graphite with a grain size of 50 nm is used, it is necessary to treat the graphite at a high temperature of 2000° C. or more in order to completely convert the graphite into diamond.

Consequently, polycrystalline diamond having a construction in which layered or relatively coarse diamond crystals are dispersed in a matrix of fine-grained diamond can be stably obtained.

Further, polycrystalline diamond having a similar construction can be obtained by performing the high pressure and high temperature treatment described above on graphite as a starting material, at a heating rate of 100 to 1000° C./minute.

Since the layered or coarse-grained diamond exhibits the effect of preventing plastic deformation and progression of fine cracks, the polycrystalline body has an extremely high hardness of 120 GPa or more, and thus is significantly excellent in wear resistance and has less property variations.

The polycrystalline diamond is used as a core and a hole is formed by a laser or the like, and a surface of the hole is polished. The polished hole surface has a surface roughness Ra of greater than or equal to 0.001 μm and less than or equal to 0.2 μm. When such a surface roughness is employed to perform wire drawing, a wire drawing resistance is suppressed low and the amount of wear is also reduced, leading to an improved life. Further, even though the polycrystalline diamond has high wear resistance, it can be polished relatively easily and machined in a short period of time.

Furthermore, if the hole is formed by a laser and polished as described above to have a circularity of greater than or equal to 0.01 μm and less than or equal to 0.2 μm when a cross section of a bearing portion is viewed, a highly precise and high quality wire material can be obtained, and the die can have a prolonged life.

EXAMPLES

Graphite powder good in crystallinity with a grain size of 0.05 to 10 μm and a purity of 99.95% or more, or synthetic diamond powder with a grain size of 0.05 to 3 μm, with ultra-finely pulverized graphite powder or a variety of non-graphite type carbon materials such as glassy carbon powder, C60 powder, and carbon nanotube powder added thereto, was introduced into an Mo capsule and sealed, and treated under various pressure and temperature conditions for 30 minutes using an ultra high pressure generation apparatus. The generated phase of an obtained sample was identified by X-ray diffraction, and the grain size of a constituent particle was examined by TEM observation. Further, the surface of the obtained sample was mirror polished, and the hardness at the polished surface was measured with a micro Knoop hardness meter. Table 1 shows experimental results.

TABLE 1

| | Starting Material | | | | Product (Polycrystalline Diamond) | | |
|---|---|---|---|---|---|---|---|
| | Base Material | Additive | Added Amount | Synthesis Conditions Pressure, Temperature | Grain Size of Coarse-Grained Portion | Grain Size of Fine Grains | Knoop Hardness |
| Example 1 | 1-3 μm Gr | 35 nm Gr | 50 vol % | 12 GPa, 2300° C. | 50-300 nm (layered) | 40 nm | 120 GPa |
| Example 2 | 1-3 μm Gr | 25 nm Gr | 70 vol % | 12 GPa, 2300° C. | 50-300 nm (layered) | 30 nm | 130 GPa |
| Example 3 | 1-3 μm Gr | 10 nm Gr | 30 vol % | 12 GPa, 2100° C. | 50-200 nm (layered) | 15 nm | 130 GPa |
| Example 4 | 0.1-1 μm Dia | 10 nm Gr | 50 vol % | 9 GPa, 1900° C. | 100-1000 nm | 15 nm | 120 GPa |
| Example 5 | 1-3 μm Gr | Glassy Carbon | 50 vol % | 9 GPa, 1900° C. | 50-200 nm (layered) | 10 nm | 120 GPa |
| Example 6 | 1-3 μm Gr | C60 | 50 vol % | 9 GPa, 1900° C. | 50-200 nm (layered) | 10 nm | 120 GPa |
| Example 7 | 1-3 μm Gr | Carbon Nanotube | 50 vol % | 9 GPa, 1900° C. | 50-200 nm (layered) | 10 nm | 120 GPa |
| Example 8 | 0.1-1 μm Dia | Glassy Carbon | 50 vol % | 9 GPa, 1900° C. | 100-1000 nm | 10 nm | 120 GPa |
| Example 9 | 0.1-1 μm Dia | C60 | 50 vol % | 9 GPa, 1900° C. | 100-1000 nm | 10 nm | 120 GPa |
| Example 10 | 0.1-1 μm Dia | Carbon Nanotube | 50 vol % | 9 GPa, 1900° C. | 100-1000 nm | 10 nm | 120 GPa |
| Comparative Example 1 | 1-3 μm Gr | None | — | 12 GPa, 2300° C. | 50-100 nm (layered) | 25 nm | 100-130 GPa |
| Comparative Example 2 | 0.1-1 μm Dia | None | — | 12 GPa, 2300° C. | 100-1000 nm | None | 70-90 GPa |
| Comparative Example 3 | Glassy Carbon | None | — | 9 GPa, 1900° C. | None | 10 nm | 95 GPa |
| Comparative Example 4 | C60 | None | — | 9 GPa, 1900° C. | None | 10 nm | 80 GPa |

The above results show that, when graphite or diamond with an average grain size of 50 nm or more, with finely pulverized graphite or a non-graphite type carbon material added thereto in a range of greater than or equal to 10% by volume and less than or equal to 95% by volume, is prepared as a starting material, and subjected to direct conversion and sintering at an ultra high pressure and an ultra high temperature, polycrystalline diamond having a construction in which layered diamond or relatively coarse diamond crystals with a grain size of 50 nm or more are dispersed in a matrix of fine-grained diamond with an average grain size of 50 nm or less is stably obtained. It is found that the obtained polycrystalline body has a hardness extremely higher than that of a sintered body of a conventional Co binder (60 to 80 GPa), and has no variations in hardness properties as seen in a polycrystalline body using graphite as a starting material.

Next, a die using the diamond of Example 1 of the diamonds described above and a die using natural monocrystalline diamond were fabricated to confirm variations in hole diameters of the dies. Since the both dies had slightly different initial hole diameters, a test was performed under the conditions that a copper wire with a diameter about 2 μm greater than an initial hole diameter was used as a wire material subjected to wire drawing, wire drawing was performed at a speed of 100 mm/s, and every time when the wire was drawn by one meter, a central portion of the drawn wire was cut out by 20 centimeters, and an average diameter was calculated based on a weight thereof. This operation was repeated 30 times, and a maximum value, a minimum value, and an average value of diameter data obtained by the 30-time operations were determined. Therefore, these values represent values obtained by drawing the wire for 30 meters. This round was repeated eight times, and FIGS. 3B and 3C are graphs thereof.

Figure 3A:
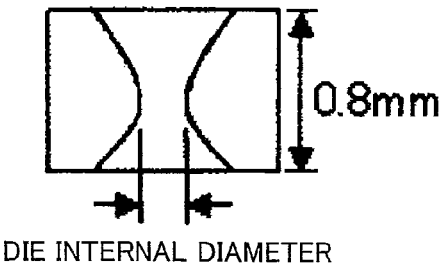
FIG. 3A is a figure showing results of a test confirming variations in hole diameters of a diamond die of the present invention and a conventional natural monocrystalline diamond die, illustrating a schematic shape of a die used in the test.
Figure 3B:
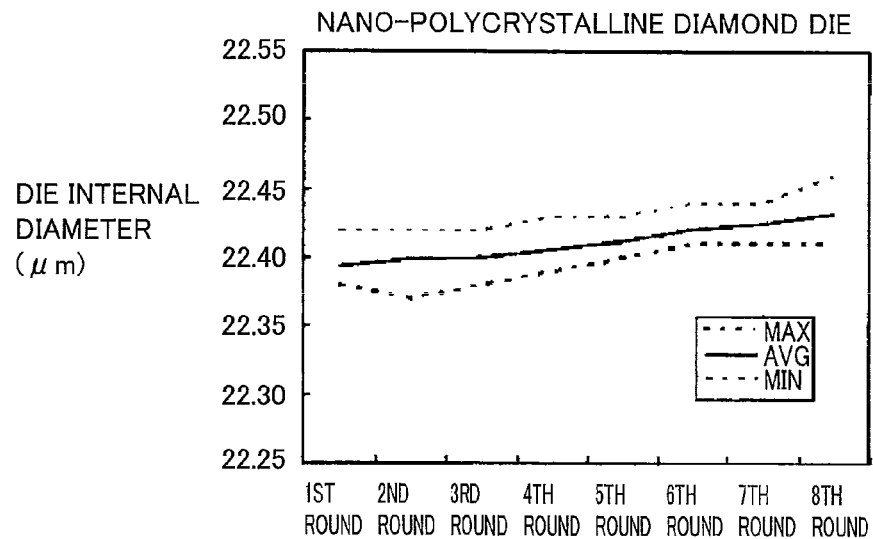
FIG. 3B is a graph showing the results of the test confirming variations in hole diameters of the diamond die of the present invention and the conventional natural monocrystalline diamond die, illustrating the result of variations in hole diameter of the diamond die of the present invention.
Figure 3C:
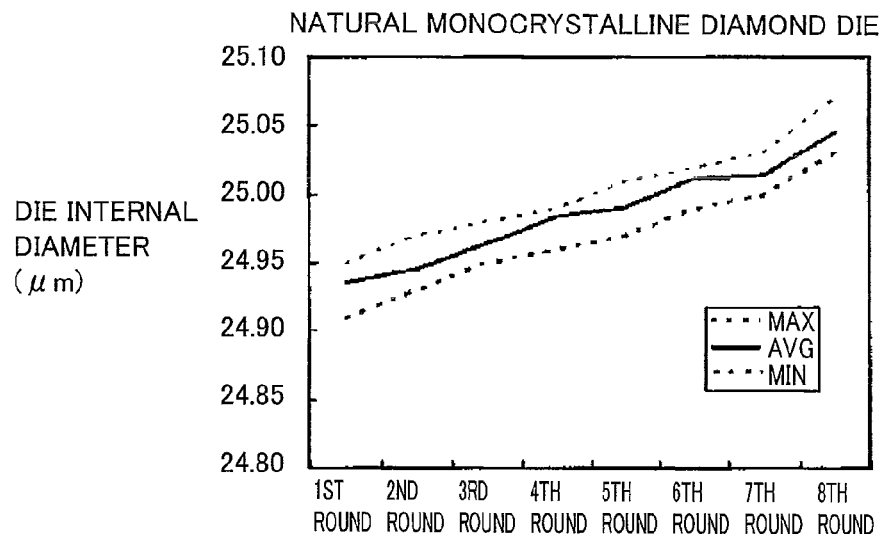
FIG. 3C is a graph showing the results of the test confirming variations in hole diameters of the diamond die of the present invention and the conventional natural monocrystalline diamond die, illustrating the result of variations in hole diameter of the conventional natural monocrystalline diamond die.

Of the lines in the results of the test illustrated in FIGS. 3B and 3C, the upper dotted line represents variations in a maximum diameter, the lower dotted line represents variations in a minimum diameter, and the central solid line represents variations in an average diameter. The results show that the speed at which the hole diameter changes in the conventional natural monocrystalline diamond die was about three times faster than that of the polycrystalline diamond die of the present invention, and it was able to be confirmed that the die of the present invention was highly excellent in durability.

For further comparison, dies using the diamond of Example 1 (die material A) of the diamonds described above (i.e., the present inventions 1 to 49), dies using conventional polycrystalline diamond (containing a Co binding agent by a dozen or so percent) made of diamond with an average grain size of 1 μm (die material B) (i.e., conventional examples 1, 2, 5, 6, 11, 12, 15, 16, 21, 22, 25, 26, 31, 32, 35, 36, 41, 42, 45, 46), and dies using conventional natural monocrystalline diamond (die material C) (i.e., conventional examples 3, 4, 7, 13, 14, 17, 23, 24, 27, 33, 34, 37, 43, 44, 47), having a plurality of shapes with different hole shapes, were fabricated. The dies were used to draw five types of wire materials, for comparison. Tables 2 to 6 show diamond materials used, surface roughnesses of working surfaces, circularities, and reduction angles, as well as results thereof. It is to be noted that, since a steel cord with a diameter of 40 μm identical to that of other wire materials was not available as a wire material, the die for drawing a steel cord had a hole diameter of 200 μm. Therefore, the results on the steel cord cannot be compared with the results on other wire materials on the same basis. Of the results shown in Tables 2 to 6, a life is indicated by an index, and the life is increased in proportion to the index. Further, concerning a flaw on a wire surface, three types of evaluations were made based on the state of a flaw on the wire surface observed after drawing the wire for 50 kilometers (for the steel cord, after drawing the steel cord for 20 kilometers). Specifically, "no flaw" indicates that no flaw was observed, "shallow flaw" indicates that a shallow flaw was observed, and "deep flaw" indicates that a deep flaw like a scratch on a wire material was observed. Further, circularity was simultaneously measured while confirming a flaw on the wire surface.

TABLE 2

Wire Type: Gold Wire
Wire Diameter: 40 μm

|  | Present Invention 1 | Present Invention 2 | Present Invention 3 | Present Invention 4 | Conventional Example 1 | Conventional Example 2 |
|---|---|---|---|---|---|---|
| Die Material | A | A | A | A | B Conventional PCD | B Conventional PCD |
| Surface Roughness Ra (μm) | 0.01 | 0.05 | 0.2 | 0.3 | 0.2 | 0.3 |
| Circularity (μm) | 0.2 | 0.2 | 0.2 | 0.2 | 0.2 | 0.2 |
| Reduction Angle | 8° | 8° | 8° | 8° | 8° | 8° |
| Results Life (Index) | 10 | 10 | 8 | 6 | 5 | 3 |
| Flaw on Wire Surface | No Flaw | No Flaw | No Flaw | Shallow Flaw | Shallow Flaw | Deep Flaw |
| Circularity After Drawing Wire for 50 km | 0.2 or less | 0.2 or less | 0.3 or less | 0.4 or less | 0.5 or less | 0.6 or less |

|  | Conventional Example 3 | Conventional Example 4 | Present Invention 5 | Present Invention 6 | Present Invention 7 | Conventional Example 5 |
|---|---|---|---|---|---|---|
| Die Material | C (Monocrystalline) | C (Monocrystalline) | A | A | A | B Conventional PCD |
| Surface Roughness Ra (μm) | 0.05 | 0.3 | 0.05 | 0.05 | 0.05 | 0.05 |
| Circularity (μm) | 0.2 | 0.2 | 0.01 | 0.05 | 0.3 | 0.05 |
| Reduction Angle | 8° | 8° | 8° | 8° | 8° | 8° |
| Results Life (Index) | 5 | 2 | 14 | 13 | 7 | 7 |
| Flaw on Wire Surface | Shallow Flaw | Deep Flaw | No Flaw | No Flaw | Shallow Flaw | Shallow Flaw |

TABLE 2-continued

Wire Type: Gold Wire
Wire Diameter: 40 μm

|  |  |  |  |  |  |  |
|---|---|---|---|---|---|---|
| Circularity After Drawing Wire for 50 km | 0.5 or less | 0.7 or less | 0.1 or less | 0.1 or less | 0.4 or less | 0.4 or less |

|  | Conventional Example 6 | Conventional Example 7 | Present Invention 8 | Present Invention 9 | Present Invention 10 |
|---|---|---|---|---|---|
| Die Material | B Conventional PCD | C (Mono-crystalline) | A | A | A |
| Surface Roughness Ra (μm) | 0.05 | 0.05 | 0.05 | 0.05 | 0.05 |
| Circularity (μm) | 0.2 | 0.05 | 0.05 | 0.05 | 0.05 |
| Reduction Angle | 8° | 8° | 12° | 16° | 20° |
| Results Life (Index) | 6 | 7 | 13 | 13 | 8 |
| Flaw on Wire Surface | Deep Flaw | Shallow Flaw | No Flaw | No Flaw | Shallow Flaw |
| Circularity After Drawing Wire for 50 km | 0.5 or less | 0.4 or less | 0.1 or less | 0.1 or less | 0.4 or less |

TABLE 3

Wire Type: Copper Wire
Wire Diameter: 40 μm

|  | Present Invention 11 | Present Invention 12 | Present Invention 13 | Present Invention 14 | Conventional Example 11 | Conventional Example 12 |
|---|---|---|---|---|---|---|
| Die Material | A | A | A | A | B Conventional PCD | B Conventional PCD |
| Surface Roughness Ra (μm) | 0.01 | 0.05 | 0.2 | 0.3 | 0.2 | 0.3 |
| Circularity (μm) | 0.2 | 0.2 | 0.2 | 0.2 | 0.2 | 0.2 |
| Reduction Angle | 8° | 8° | 8° | 8° | 8° | 8° |
| Results Life (Index) | 10 | 10 | 8 | 6 | 5 | 3 |
| Flaw on Wire Surface | No Flaw | No Flaw | No Flaw | Shallow Flaw | Shallow Flaw | Deep Flaw |
| Circularity After Drawing Wire for 50 km | 0.2 or less | 0.2 or less | 0.3 or less | 0.4 or less | 0.5 or less | 0.6 or less |

|  | Conventional Example 13 | Conventional Example 14 | Present Invention 15 | Present Invention 16 | Present Invention 17 | Conventional Example 15 |
|---|---|---|---|---|---|---|
| Die Material | C (Mono-crystalline) | C (Mono-crystalline) | A | A | A | B Conventional PCD |
| Surface Roughness Ra (μm) | 0.2 | 0.3 | 0.05 | 0.05 | 0.05 | 0.05 |
| Circularity (μm) | 0.2 | 0.2 | 0.01 | 0.05 | 0.3 | 0.05 |
| Reduction Angle | 8° | 8° | 8° | 8° | 8° | 8° |
| Results Life (Index) | 5 | 2 | 14 | 13 | 7 | 7 |
| Flaw on Wire Surface | Shallow Flaw | Deep Flaw | No Flaw | No Flaw | Shallow Flaw | Shallow Flaw |
| Circularity After Drawing Wire for 50 km | 0.5 or less | 0.7 or less | 0.1 or less | 0.1 or less | 0.4 or less | 0.4 or less |

|  | Conventional Example 16 | Conventional Example 17 | Present Invention 18 | Present Invention 19 | Present Invention 20 |
|---|---|---|---|---|---|
| Die Material | B Conventional PCD | C (Mono-crystalline) | A | A | A |
| Surface Roughness Ra (μm) | 0.05 | 0.05 | 0.05 | 0.05 | 0.05 |
| Circularity (μm) | 0.2 | 0.05 | 0.05 | 0.05 | 0.05 |
| Reduction Angle | 8° | 8° | 12° | 16° | 20° |
| Results Life (Index) | 6 | 7 | 13 | 13 | 8 |
| Flaw on Wire Surface | Deep Flaw | Shallow Flaw | No Flaw | No Flaw | Shallow Flaw |

TABLE 3-continued

Wire Type: Copper Wire
Wire Diameter: 40 μm

| | | | | | |
|---|---|---|---|---|---|
| Circularity After Drawing Wire for 50 km | 0.5 or less | 0.4 or less | 0.1 or less | 0.1 or less | 0.4 or less |

TABLE 4

Wire Type: Tungsten Wire
Wire Diameter: 40 μm

| | | Present Invention 21 | Present Invention 22 | Present Invention 23 | Present Invention 24 | Conventional Example 21 | Conventional Example 22 |
|---|---|---|---|---|---|---|---|
| Die Material | | A | A | A | A | B Conventional PCD | B Conventional PCD |
| Surface Roughness Ra (μm) | | 0.01 | 0.05 | 0.2 | 0.3 | 0.2 | 0.3 |
| Circularity (μm) | | 0.2 | 0.2 | 0.2 | 0.2 | 0.2 | 0.2 |
| Reduction Angle | | 6° | 6° | 6° | 6° | 6° | 6° |
| Results | Life (Index) | 6 | 6 | 5 | 4 | 3 | 2 |
| | Flaw on Wire Surface | No Flaw | No Flaw | No Flaw | Shallow Flaw | Shallow Flaw | Deep Flaw |
| | Circularity After Drawing Wire for 50 km | 0.3 or less | 0.3 or less | 0.4 or less | 0.5 or less | 0.6 or less | 0.7 or less |

| | | Conventional Example 23 | Conventional Example 24 | Present Invention 25 | Present Invention 26 | Present Invention 27 | Conventional Example 25 |
|---|---|---|---|---|---|---|---|
| Die Material | | C (Monocrystalline) | C (Monocrystalline) | A | A | A | B Conventional PCD |
| Surface Roughness Ra (μm) | | 0.2 | 0.3 | 0.05 | 0.05 | 0.05 | 0.05 |
| Circularity (μm) | | 0.2 | 0.2 | 0.01 | 0.05 | 0.3 | 0.05 |
| Reduction Angle | | 6° | 6° | 6° | 6° | 6° | 6° |
| Results | Life (Index) | 3 | 1 | 9 | 8 | 4 | 4 |
| | Flaw on Wire Surface | Shallow Flaw | Deep Flaw | No Flaw | No Flaw | Shallow Flaw | Shallow Flaw |
| | Circularity After Drawing Wire for 50 km | 0.6 or less | 0.8 or less | 0.2 or less | 0.2 or less | 0.5 or less | 0.5 or less |

| | | Conventional Example 26 | Conventional Example 27 | Present Invention 28 | Present Invention 29 | Present Invention 30 |
|---|---|---|---|---|---|---|
| Die Material | | B Conventional PCD | C (Monocrystalline) | A | A | A |
| Surface Roughness Ra (μm) | | 0.05 | 0.05 | 0.05 | 0.05 | 0.05 |
| Circularity (μm) | | 0.2 | 0.05 | 0.05 | 0.05 | 0.05 |
| Reduction Angle | | 6° | 6° | 10° | 14° | 18° |
| Results | Life (Index) | 3 | 4 | 8 | 8 | 5 |
| | Flaw on Wire Surface | Deep Flaw | Shallow Flaw | No Flaw | No Flaw | Shallow Flaw |
| | Circularity After Drawing Wire for 50 km | 0.6 or less | 0.5 or less | 0.2 or less | 0.2 or less | 0.5 or less |

TABLE 5

Wire Type: Stainless Wire
Wire Diameter: 40 μm

|  | Present Invention 31 | Present Invention 32 | Present Invention 33 | Present Invention 34 | Conventional Example 31 | Conventional Example 32 |
|---|---|---|---|---|---|---|
| Die Material | A | A | A | A | B Conventional PCD | B Conventional PCD |
| Surface Roughness Ra (μm) | 0.01 | 0.05 | 0.2 | 0.3 | 0.2 | 0.3 |
| Circularity (μm) | 0.2 | 0.2 | 0.2 | 0.2 | 0.2 | 0.2 |
| Reduction Angle | 6° | 6° | 6° | 6° | 6° | 6° |
| Results Life (Index) | 8 | 8 | 6 | 5 | 4 | 2 |
| Flaw on Wire Surface | No Flaw | No Flaw | No Flaw | Shallow Flaw | Shallow Flaw | Deep Flaw |
| Circularity After Drawing Wire for 50 km | 0.2 or less | 0.2 or less | 0.3 or less | 0.4 or less | 0.5 or less | 0.6 or less |

|  | Conventional Example 33 | Conventional Example 34 | Present Invention 35 | Present Invention 36 | Present Invention 37 | Conventional Example 35 |
|---|---|---|---|---|---|---|
| Die Material | C (Mono-crystalline) | C (Mono-crystalline) | A | A | A | B Conventional PCD |
| Surface Roughness Ra (μm) | 0.2 | 0.3 | 0.05 | 0.05 | 0.05 | 0.05 |
| Circularity (μm) | 0.2 | 0.2 | 0.01 | 0.05 | 0.3 | 0.05 |
| Reduction Angle | 6° | 6° | 6° | 6° | 6° | 6° |
| Results Life (Index) | 4 | 2 | 11 | 10 | 6 | 6 |
| Flaw on Wire Surface | Shallow Flaw | Deep Flaw | No Flaw | No Flaw | Shallow Flaw | Shallow Flaw |
| Circularity After Drawing Wire for 50 km | 0.5 or less | 0.7 or less | 0.1 or less | 0.1 or less | 0.4 or less | 0.4 or less |

|  | Conventional Example 36 | Conventional Example 37 | Present Invention 38 | Present Invention 39 | Present Invention 40 |
|---|---|---|---|---|---|
| Die Material | B Conventional PCD | C (Mono-crystalline) | A | A | A |
| Surface Roughness Ra (μm) | 0.05 | 0.05 | 0.05 | 0.05 | 0.05 |
| Circularity (μm) | 0.2 | 0.05 | 0.05 | 0.05 | 0.05 |
| Reduction Angle | 6° | 6° | 10° | 14° | 18° |
| Results Life (Index) | 5 | 6 | 10 | 10 | 6 |
| Flaw on Wire Surface | Deep Flaw | Shallow Flaw | No Flaw | No Flaw | Shallow Flaw |
| Circularity After Drawing Wire for 50 km | 0.5 or less | 0.4 or less | 0.1 or less | 0.1 or less | 0.4 or less |

TABLE 6

Wire Type: Steel Cord
Wire Diameter: 200 μm

|  | Present Invention 41 | Present Invention 42 | Present Invention 43 | Present Invention 44 | Conventional Example 41 | Conventional Example 42 |
|---|---|---|---|---|---|---|
| Die Material | A | A | A | A | B Conventional PCD | B Conventional PCD |
| Surface Roughness Ra (μm) | 0.01 | 0.05 | 0.2 | 0.3 | 0.2 | 0.3 |
| Circularity (μm) | 0.2 | 0.2 | 0.2 | 0.2 | 0.2 | 0.2 |
| Reduction Angle | 6° | 6° | 6° | 6° | 6° | 6° |
| Results Life (Index) | 8 | 8 | 6 | 4 | 4 | 2 |
| Flaw on Wire Surface | No Flaw | No Flaw | No Flaw | Shallow Flaw | Shallow Flaw | Deep Flaw |
| Circularity After Drawing Wire for 20 km | 0.2 or less | 0.2 or less | 0.3 or less | 0.5 or less | 0.5 or less | 0.6 or less |

TABLE 6-continued

Wire Type: Steel Cord
Wire Diameter: 200 μm

|  | Conventional Example 43 | Conventional Example 44 | Present Invention 45 | Present Invention 46 | Conventional Example 45 |
|---|---|---|---|---|---|
| Die Material | C (Monocrystalline) | C (Monocrystalline) | A | A | B Conventional PCD |
| Surface Roughness Ra (μm) | 0.2 | 0.3 | 0.05 | 0.05 | 0.05 |
| Circularity (μm) | 0.2 | 0.2 | 0.1 | 0.3 | 0.05 |
| Reduction Angle | 6° | 6° | 6° | 6° | 6° |
| Results Life (Index) | 1 | 1 | 11 | 6 | 5 |
| Flaw on Wire Surface | Unmeasurable | Unmeasurable | No Flaw | Shallow Flaw | Shallow Flaw |
| Circularity After Drawing Wire for 20 km | Crack Occurred | Crack Occurred | 0.1 or less | 0.4 or less | 0.4 or less |

|  | Conventional Example 46 | Conventional Example 47 | Present Invention 47 | Present Invention 48 | Present Invention 49 |
|---|---|---|---|---|---|
| Die Material | B Conventional PCD | C (Monocrystalline) | A | A | A |
| Surface Roughness Ra (μm) | 0.05 | 0.05 | 0.05 | 0.05 | 0.05 |
| Circularity (μm) | 0.2 | 0.05 | 0.1 | 0.1 | 0.1 |
| Reduction Angle | 6° | 6° | 10° | 14° | 18° |
| Results Life (Index) | 3 | 1 | 10 | 9 | 7 |
| Flaw on Wire Surface | Deep Flaw | Unmeasurable | No Flaw | No Flaw | Shallow Flaw |
| Circularity After Drawing Wire for 20 km | 0.5 or less | Crack Occurred | 0.2 or less | 0.2 or less | 0.4 or less |

As is obvious from these results, when the die of the present invention is compared with an conventional die, due to the differences in surface roughness, circularity, and reduction angle, the die of the present invention is excellent in life and occurrence of a flaw on the wire surface, and high precision wire drawing with less variations in circularity can be performed for a long period of time.

The invention claimed is:

1. A wire drawing die having
(a) a core formed of polycrystalline diamond having no variations in hardness properties, made only of diamond and produced by: directly converting into diamond a starting material of (i) a non-diamond type carbon material with a grain size of 50 nm or more and (ii) a non-graphite type carbon material or a finely pulverized graphite added to said non-diamond type carbon material; and sintering the diamond at an ultra high pressure and an ultra high temperature without adding a sintering aid or a catalyst,
said polycrystalline diamond having a mixed construction including fine-grained diamond with a maximum grain size of less than or equal to 100 nm and an average grain size of less than or equal to 50 nm and plate-like or particulate coarse-grained diamond with a minimum grain size of greater than or equal to 50 nm and a maximum grain size of less than or equal to 10000 nm, and
(b) a hole configured in the core to permit passage of a wire material to be drawn through said hole,
wherein said polycrystalline diamond has a construction in which layered or relatively coarse diamond crystals are dispersed in a matrix of fine-grained diamond.

2. The wire drawing die according to claim 1, wherein said fine-grained diamond has a maximum grain size of less than or equal to 50 nm and an average grain size of less than or equal to 30 nm.

3. The wire drawing die according to claim 1, wherein said coarse-grained diamond has a minimum grain size of greater than or equal to 50 nm and a maximum grain size of less than or equal to 1000 nm.

4. The wire drawing die according to claim 1, wherein the hole formed in said polycrystalline diamond has at least a surface working for machining with a surface roughness Ra of greater than or equal to 0.001 μm and less than or equal to 0.2 μm.

5. The wire drawing die according to claim 1, wherein the hole formed in said polycrystalline diamond has a circularity of greater than or equal to 0.01 μm and less than or equal to 0.2 μm when a cross section of a bearing portion is viewed.

6. A method of manufacturing a wire which method comprises subjecting a wire material to wire drawing through a wire drawing die according to claim 1.

7. The method of manufacturing a wire according to claim 6, wherein the wire material subjected to wire drawing is a copper wire, and said hole has a shape with a reduction angle of 8 to 16°.

8. The method of manufacturing a wire according to claim 6, wherein the wire material subjected to wire drawing is a tungsten wire, and said hole has a shape with a reduction angle of 6 to 14°.

9. The method of manufacturing a wire according to claim 6, wherein the wire material subjected to wire drawing is a stainless wire, and said hole has a shape with a reduction angle of 6 to 14°.

10. The method of manufacturing a wire according to claim 6, wherein the wire material subjected to wire drawing is a steel cord, and said hole has a shape with a reduction angle of 6 to 14°.

11. The method of manufacturing a wire according to claim 6, wherein the wire material subjected to wire drawing is a gold wire, and said hole has a shape with a reduction angle of 8 to 16°.

12. The wire drawing die according to claim 1, wherein said polycrystalline diamond is produced from a starting material comprising plate-like graphite with a grain size of 50 nm or more having added thereto from 10% by volume to 95% by volume of non-graphite carbon material.

* * * * *